(12) United States Patent
Arora et al.

(10) Patent No.: US 10,932,063 B2
(45) Date of Patent: Feb. 23, 2021

(54) THIN AND FLEXIBLE SELF-POWERED VIBRATION TRANSDUCER EMPLOYING TRIBOELECTRIC NANOGENERATION

(71) Applicant: Georgia Tech Research Corporation, Atlanta, GA (US)

(72) Inventors: Nivedita Arora, Atlanta, GA (US); Gregory D. Abowd, Atlanta, GA (US); Mohit Gupta, Atlanta, GA (US); Diego Osorio, Atlanta, GA (US); Seyedeh Fereshteh Shahmiri, Atlanta, GA (US); Thad Eugene Starner, Atlanta, GA (US); Yi-Cheng Wang, Atlanta, GA (US); Zhengjun Wang, Atlanta, GA (US); Zhong Lin Wang, Atlanta, GA (US); Steven L Zhang, Atlanta, GA (US); Peter McAughan, Houston, TX (US); Qiuyue Xue, Atlanta, GA (US); Dhruva Bansal, Atlanta, GA (US); Ryan Bahr, Atlanta, GA (US); Emmanouil Tentzeris, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/425,514

(22) Filed: May 29, 2019

(65) Prior Publication Data
US 2019/0373375 A1 Dec. 5, 2019

Related U.S. Application Data

(60) Provisional application No. 62/677,486, filed on May 29, 2018.

(51) Int. Cl.
*H04R 19/01* (2006.01)
*H02N 1/04* (2006.01)
(Continued)

(52) U.S. Cl.
CPC ............. *H04R 19/016* (2013.01); *H01Q 9/16* (2013.01); *H02N 1/04* (2013.01); *H04R 3/00* (2013.01);
(Continued)

(58) Field of Classification Search
CPC ........ H04R 19/016; H04R 3/00; H04R 19/04; H04R 31/003; H04R 2307/025;
(Continued)

(56) References Cited

U.S. PATENT DOCUMENTS

| | | |
|---|---|---|
| 9,178,446 B2 | 11/2015 | Wang et al. |
| 9,484,842 B2 | 11/2016 | Wang et al. |

(Continued)

OTHER PUBLICATIONS

Fan et al, Ultrathin Rollable Paper based Triboelectric Nanogenerator for Acoustic Energy Harvesting and self powered sound Recording (Year: 2015).*

(Continued)

*Primary Examiner* — Davetta W Goins
*Assistant Examiner* — Kuassi A Ganmavo
(74) *Attorney, Agent, or Firm* — Bryan W. Bockhop; Bockhop Intellectual Property Law, LLC

(57) ABSTRACT

A vibration transducer for sensing vibrations includes a first flexible triboelectric member, a second flexible triboelectric member, a plurality of attachment points, a first electrode and a second electrode. The first flexible triboelectric member includes a first triboelectric layer and a material being on a first position on a triboelectric series. A conductive layer is deposited on the second side thereof. The second flexible triboelectric member includes a second triboelectric layer and a material being on a second position on the triboelectric series that is different from the first position on the triboelectric series. The second triboelectric member is adjacent to the first flexible triboelectric member. When the first (Continued)

triboelectric member comes into and out of contact with the second triboelectric member as a result of the vibrations, a triboelectric potential difference having a variable intensity corresponding to the vibrations can be sensed between the first and second triboelectric members.

16 Claims, 4 Drawing Sheets

(51) Int. Cl.

| | | |
|---|---|---|
| *H04R 19/04* | (2006.01) | |
| *H04R 3/00* | (2006.01) | |
| *H01Q 9/16* | (2006.01) | |
| *H04R 31/00* | (2006.01) | |
| *H01G 7/06* | (2006.01) | |
| *H01Q 7/02* | (2006.01) | |
| *H02N 1/08* | (2006.01) | |
| *B81B 3/00* | (2006.01) | |

(52) U.S. Cl.
CPC ........... *H04R 19/04* (2013.01); *H04R 31/003* (2013.01); *B81B 3/00* (2013.01); *H01G 7/06* (2013.01); *H01Q 7/02* (2013.01); *H02N 1/08* (2013.01); *H04R 2307/025* (2013.01)

(58) Field of Classification Search
CPC ... H01Q 9/16; H02N 1/04; H02N 1/08; B81B 3/00; H01G 7/02; H01G 7/06
See application file for complete search history.

(56) References Cited

U.S. PATENT DOCUMENTS

| | | |
|---|---|---|
| 9,543,860 B2 | 1/2017 | Wang et al. |
| 9,595,894 B2 | 3/2017 | Wang et al. |
| 9,790,928 B2 | 10/2017 | Wang et al. |
| 9,812,993 B2 | 11/2017 | Wang et al. |
| 9,985,554 B2 | 5/2018 | Wang et al. |
| 2010/0198094 A1* | 8/2010 | Turicchia ............... A61B 7/045 600/528 |
| 2014/0246951 A1* | 9/2014 | Wang ...................... H02N 1/04 310/310 |
| 2014/0309866 A1* | 10/2014 | Ricci ....................... H04W 4/21 701/36 |
| 2014/0338458 A1* | 11/2014 | Wang ..................... G01H 11/06 73/658 |
| 2016/0344308 A1* | 11/2016 | Wang ...................... H02N 1/04 |
| 2017/0331397 A1* | 11/2017 | Kim ........................ H02N 2/18 |
| 2018/0013358 A1* | 1/2018 | Turng ..................... H02N 1/04 |

OTHER PUBLICATIONS

Talla, Battery Free Cellphone (Year: 2017).*
Zhang et al, Progress in triboelectric Nanogenerators as self powered smart sensors (Year: 2017).*
Yu et al, Triboelectric Nanogenerator as a self powered communication unit for processing and transmitting information (Year: 2016).*
Brooker et al.: "Lev Termen's Great Seal Bug Analyzed"; IEEE; Jun. 10, 2013.
Talla et al.: "Ba!ery-Free Cellphone"; Proceedings of the ACM on Interactive, Mobile, Wearable and Ubiquitous Technologies, vol. 1, No. 2, Article 25; Jun. 2017.
Chen et al.: "Harmonic-Resonator-Based Triboelectric Nanogenerator as a Sustainable Power Source and a Self-Powered Active Vibration Sensor"; Advanced Materials; 2013.
Fan et al.: "Ultrathin, Rollable, Paper-Based Triboelectric Nanogenerator for Acoustic Energy Harvesting and Self-Powered Sound Recording"; ACS Nano; 2015.

* cited by examiner

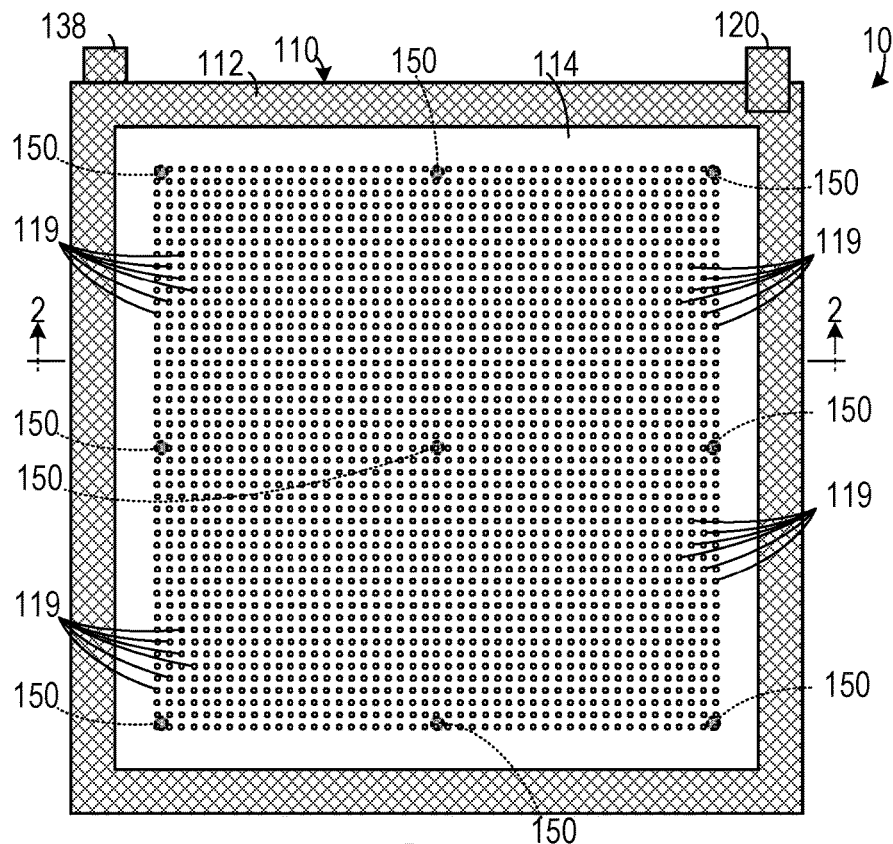
FIG. 1A
FIG. 1B
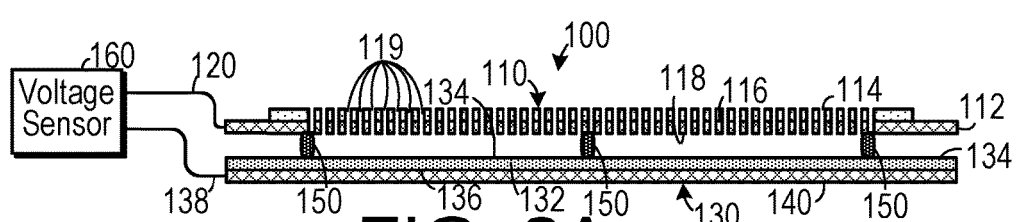
FIG. 2A
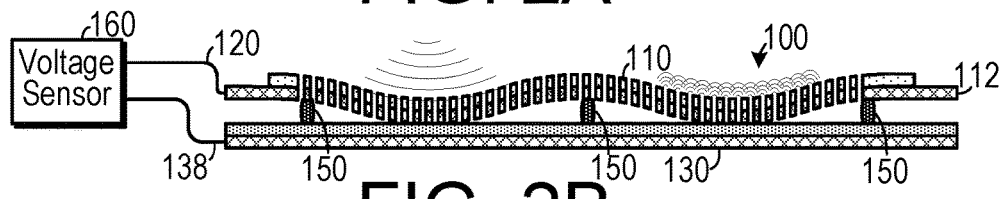
FIG. 2B
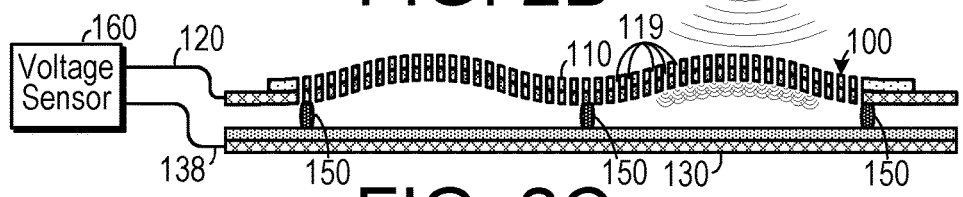
FIG. 2C

THIN AND FLEXIBLE SELF-POWERED VIBRATION TRANSDUCER EMPLOYING TRIBOELECTRIC NANOGENERATION

BACKGROUND OF THE INVENTION

1. Field of the Invention

The present invention relates to vibration transducers and, more specifically, to a self-powered vibration transducer.

2. Description of the Related Art

A microphone is a transducer that converts sound energy into electrical energy. A conventional microphone employs a diaphragm, which is a thin piece of a material—such as plastic, paper or aluminum—that vibrates in response to sound waves. A coil that is affixed to the diaphragm is placed in a magnet (or sometimes the magnet affixed to the diaphragm is placed inside of the coil), and an electric current is generated as a result of the movement of the coil relative to the magnet in proportion to the movement of the diaphragm in response to the sound waves. Thus the electrical current is proportional in intensity to the sound waves. Many microphones require that a voltage be applied to the microphone and the current generated by the movement of the diaphragm causes perturbations in this voltage.

As ubiquitous as microphones may seem today, there is still room for progress. A microphone's design balances several important features, including recording quality, form factor (e.g., size, weight, flexibility, thickness), and power consumption. Electronic devices most commonly use electret or condenser microphones based on MEMS technology. CMOS-MEMS acoustic devices allow miniaturization and on-chip electronics, but are active, that is, they require power for operation and sound amplification. Commercially available passive (or self-powered) microphones do not consume power but are bulky (e.g., a moving coil dynamic microphone) or use PVDF films, which either results in a low sensitivity contact microphone or complex to manufacture and costly to scale in size. A challenge lies in designing a microphone which is passive and has sound quality comparable to its active counterparts (acoustic sensitivity>– 25 dBSPL) while still preserving a lightweight and versatile form factor.

Recently developed, triboelectric generators generate electrical power using the triboelectrification and electrostatic induction effects, which can convert mechanical vibrations into electric signal output without applying an external power source.

Therefore, there is a need for a thin, self-powered transducer, such as a microphone, that can easily be manufactured.

SUMMARY OF THE INVENTION

The disadvantages of the prior art are overcome by the present invention which, in one aspect, is a vibration transducer for sensing vibrations that includes a first flexible triboelectric member, a second flexible triboelectric member, a plurality of attachment points, a first electrode and a second electrode. The first flexible triboelectric member includes a first triboelectric layer having a first side, an opposite second side and a peripheral edge. The first triboelectric layer includes a material being on a first position on a triboelectric series. The first flexible triboelectric member also includes a conductive layer deposited on the second side thereof. The second flexible triboelectric member includes a second triboelectric layer having a first side, an opposite second side and a peripheral edge. The second triboelectric layer includes a material being on a second position on the triboelectric series that is different from the first position on the triboelectric series. The second triboelectric member is adjacent to the first flexible triboelectric member so that the second side of the second triboelectric layer faces the first side of the first triboelectric layer and is spaced apart therefrom at a distance that results in partial contact between the first triboelectric layer and the second triboelectric layer when the vibrations impinge on the vibration transducer while at rest. At least one of the first flexible triboelectric member and the second flexible triboelectric member define an array of a plurality of holes passing therethrough. Each of the plurality of holes has a diameter within a predetermined range. The plurality of attachment points affixes the first triboelectric member to the second triboelectric member. At least a first set of the attachment points is disposed along a periphery of the vibration transducer and at least one attachment point is disposed interior to the periphery of the vibration transducer. The first electrode is electrically coupled to the first triboelectric member. The second electrode is electrically coupled to the second triboelectric member. When the first triboelectric member comes into and out of contact with the second triboelectric member as a result of the vibrations, a triboelectric potential difference having a variable intensity corresponding to the vibrations can be sensed between the first electrode and the second electrode.

In another aspect, the invention is a responsive vibration transducer that includes a first flexible triboelectric member, a second triboelectric member and an antenna member. The antenna member is electrically coupled to the first flexible triboelectric member and to the second triboelectric member. When the first triboelectric member comes into and out of contact with the second triboelectric member as a result of the vibrations, a triboelectric potential difference having a variable intensity corresponding to the vibrations can be sensed there-between. When a querying radio-frequency carrier wave is transmitted to the antenna member, a local potential is induced in the transducer and the vibrations are modulated onto the local current resulting in a back scatter radio-frequency signal that corresponds to a modulation of the vibrations onto the carrier wave being generated by the transducer.

In yet another aspect, the invention is a method of making a transducer, in which a conductive layer is deposited on a second side of a first triboelectric layer having a first side, an opposite second side and a peripheral edge. The first triboelectric layer includes a material being on a first position on a triboelectric series, so as to form a first flexible triboelectric member. A second triboelectric member is generated so as to include a second triboelectric layer having a first side, an opposite second side and a peripheral edge. The second triboelectric layer includes a material being on a second position on the triboelectric series that is different from the first position on the triboelectric series. An array of a plurality of holes passing through at least one of the first triboelectric member and the second triboelectric member is defined so that each of the plurality of holes has a diameter within a predetermined range. The second triboelectric member is placed so as to be adjacent to the first flexible triboelectric member so that the second side of the second triboelectric layer faces the first side of the first triboelectric layer and is spaced apart therefrom at a distance that results in partial contact between the first triboelectric layer and the second triboelectric layer when the vibrations impinge on the vibration transducer while at rest. A plurality of attachment points is applied so as to affix the first triboelectric member to the second triboelectric member so that each of the plurality of attachment points is disposed at a position so as to maximize energy production by the transducer.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 1A is a schematic diagram, showing one first representative embodiment of a transducer.

FIG. 1B is a circuit diagram, showing one model for the embodiment shown in FIG. 1A.

FIGS. 2A-2C area schematic diagrams, showing cross-sectional views of the embodiment shown in FIG. 1A, taken along line 2-2.

DETAILED DESCRIPTION OF THE INVENTION

Figure 3A:
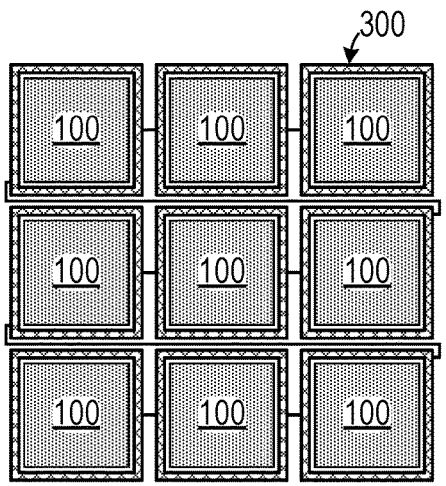
FIG. 3A is a schematic diagram, showing one embodiment of an array of transducers.

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

The present invention employs the triboelectric effect of the type exploited by triboelectric generators to transduce vibrations, such as sound waves, into electrical signals. U.S. Pat. No. 9,178,446, issued to Wang et al., describes the theory and operation of triboelectric generators and is incorporated herein by reference for the purpose of disclosing the same.

As shown in FIGS. 1 and 2A-2C, one embodiment of a vibration (such as sound) transducer 100 includes a first triboelectric member 130 separated from a second triboelectric member 110 by a plurality of attachment points 150 (such as glue points). (In one embodiment, the transducer 100 is configured as a sound transducer such as a microphone. In other embodiments, it can be configured to sense other vibrations in the air that are outside of the sonic range.) The first triboelectric member includes a first triboelectric layer 132 (which could include, for example, materials such as polytetrafluoroethylene (PTFE) or fluorinated ethylene propylene (FEP), or one of the many other materials that exhibit triboelectric properties know to those of skill in the art, which can generally include many fluoropolymers and other dielectrics) and has a first side 134 and an opposite second side 136. (It should be noted that, unlike the triboelectric generator disclosed in U.S. Pat. No. 9,178,446, the first triboelectric layer 132 does not require nanowires extending therefrom.) A first conductive layer 140 is applied to the second side 136 of the first triboelectric layer 132. The first conductive layer 140 can include conductive materials such as copper or other conductive metals or any of the many other conductive materials known in the art and can be applied to the first triboelectric layer 132, for example, using chemical vapor deposition.

The second triboelectric member 110 includes a second triboelectric layer 112, which is also conductive in one embodiment and that has a position on a triboelectric series that is different (e.g., more positive) from that of the first triboelectric layer 132. The conductive second triboelectric layer 112 has a first side 116 and an opposite second side 118. The conductive triboelectric layer 112 can include a material such as copper. In one embodiment, the conductive triboelectric layer 112 is deposited (for example, using chemical vapor deposition or one of the many metal deposition methods known to the art) onto a substrate 114 (for example, a paper substrate, a plastic substrate or a substrate made of one of the many other substrate materials known to the art).

A plurality of holes 119 are defined so as to pass through the second triboelectric member 110. The holes 119 can be formed using a laser or other device for making holes in a thin sheet (e.g, etching or punching in commercial embodiments). In the embodiment shown in FIG. 1A, the transducer 100 has a quadrilateral (e.g., square) shape and the holes 119 are arranged in a grid pattern. As will be shown below, circular transducers with holes disposed in circular patterns are also possible. While not shown, many other shapes of transducers and hole placement patterns are possible without departing from the scope of the invention. As shown in FIG. 1B, the transducer 100 can be modeled as a varying (such as alternating current) voltage source 102 in series with a variable capacitor 104.

A first electrode 138 is in electrical communication with the first conductive layer 140 and a second electrode 120 is in electrical communication with the second conductive layer 112. A voltage sensor 160, or other voltage sensitive device, can sense a varying voltage between the first electrode 138 and the second electrode 120 as the second triboelectric layer 112 comes in and out of contact with the first triboelectric layer 132.

The transducer 100 at rest is shown in FIG. 2A. As shown in FIG. 2B, when the transducer 100 is subject to the compression phase of a sound wave, air passes through the holes 119 and the second triboelectric member 110 is forced into partial contact with the first triboelectric member 130. This effects a redistribution of charge at the surface of the different layers. During the rarefaction phase of the sound wave, as shown in FIG. 2C, the second triboelectric member 110 is drawn away from the first triboelectric member 130, in which a charge imbalance occurs because of the previous transfer of electrons. This results in a potential difference between the first electrode 138 and the second electrode 120, which is sensed by the voltage sensor 160.

In an experimental embodiment employing PTFE and a paper substrate, when a compression is incident on the transducer 100 it causes vibrations in its membrane-like structure, resulting in the copper layer on the paper coming in contact with the PTFE. Contact electrification generates charges on both surfaces—PTFE, which has a greater electron affinity, is able to gain electrons from the copper and becomes negatively charged, whereas the copper layer on the paper becomes positively charged. When subsequent rarefaction separates the paper and the PTFE, it induces a potential difference across the two copper electrodes, causing current to flow from paper towards PTFE if the device is connected to an external load. This flow of current reverses the polarity of charges on the two copper electrodes (i.e., now the copper on PTFE has more positive charge than the copper layer on the paper). The next compression results in the paper moving towards the PTFE again, resulting in a reversed direction of current flow, completing the cycle of electricity generation. In one experimental embodiment, the holes are spaced apart from each other at a hole spacing distance of about 0.4 mm and the spacing distance between the holes is about 0.4 mm.

Figure 3B:
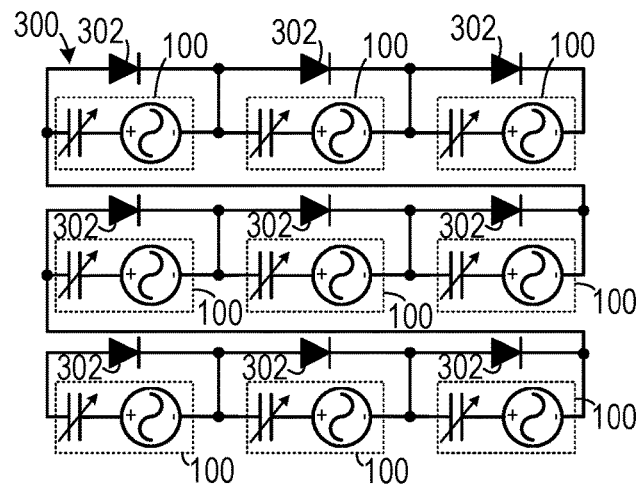
FIG. 3B is a circuit diagram, showing one model for the embodiment shown in FIG. 3A.

A shown in FIGS. 3A and 3B, a plurality of transducers 100 can be connected in an array 300 to generate an increased power output. These transducers 100, as shown in FIG. 3B, can be coupled with a diode 302 to insure that they are all in phase.

Figure 4:
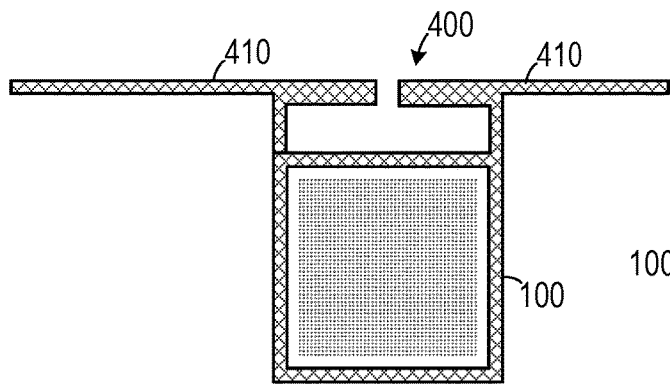
FIG. 4 is a schematic diagram, showing one representative embodiment of a responsive transducer.

As shown in FIG. 4, an antenna member 400 can be coupled to the transducer 100. In the embodiment shown, the antenna member 400 includes two separated conductors 410 that results in a dipole antenna. (However, as will be discussed below, other antenna configurations may be used.) By adding the antenna member 400, the transducer 100 can convert impinging sound waves into an electromagnetic signal.

Figure 5:
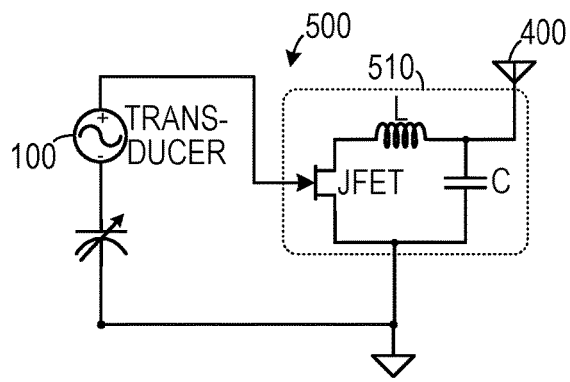
FIG. 5 is a circuit diagram, showing one model for a responsive transducer with an active element.
Figure 6:
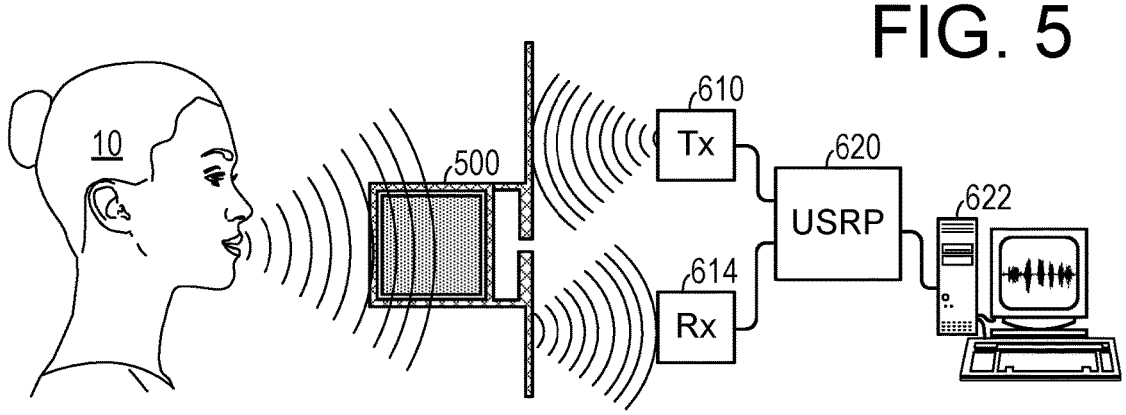
FIG. 6 is a schematic diagram, showing a responsive transducer being queried with a querying apparatus.
Figure 7:
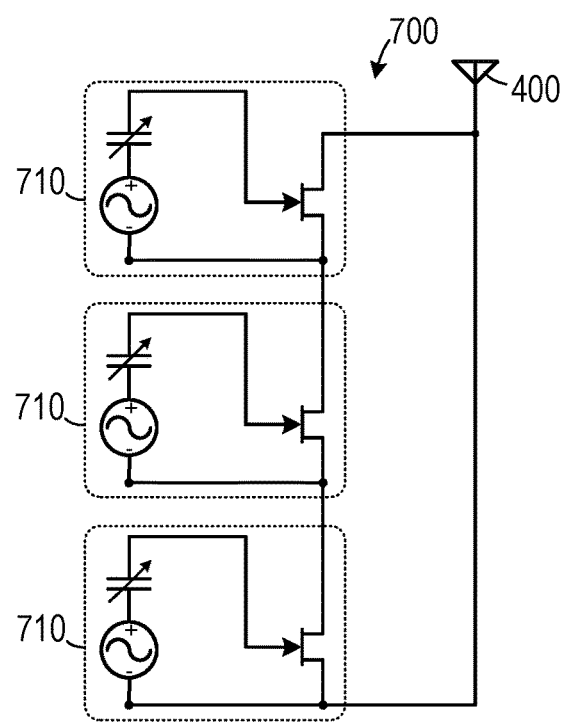
FIG. 7 is a circuit diagram, showing one model of a plurality of transducers with active elements and an antenna member.
Figure 8:
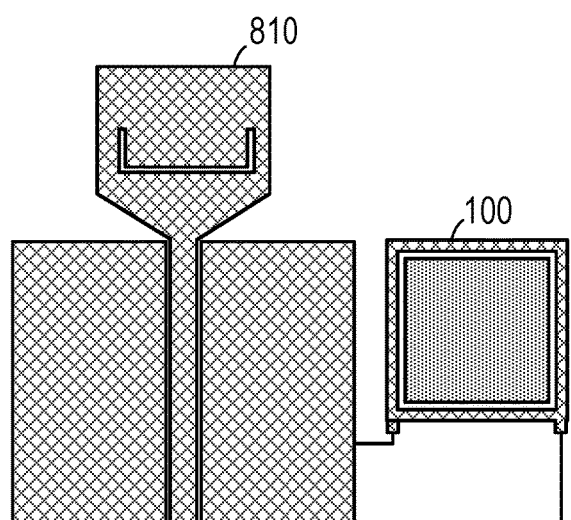
FIG. 8 is a schematic diagram, showing a transducer with a JFET and a first alternative antenna.

As shown in FIG. 5, a circuit 510, which includes an active element, such as a JFET that has a gate driven by one conductor of the transducer 100 can be used as a responsive device 500. This is employed to exploit RF backscatter to produce a passive means of wireless transmission of the vibration signal incident upon the transducer 100. In this embodiment, the output of the transducer 100 modulates the impedance of the JFET. For example, as shown in FIG. 6, the responsive device 500 can receive a querying radio frequency carrier wave signal from a transmitter 610 and modulate a sound signal from a person 10 speaking onto the carrier wave signal. The device 500 then transmits the modulated signal as backscatter, which is received by a receiver 614. The transmitter 610 and the receiver 614 can be coupled to a USRP RFID device 620, which transmits the radio frequency carrier wave and reads the backscatter. A computer 622 can then process the signal for various applications. As shown in FIG. 7, several responsive devices 710 can be connected in an array 700 to increase the power output.

In operation, the drain the JFET (also sometimes referred to the positive supply of the microphone) is connected to the positive voltage rail via a resistor to configure the JFET as a common source amplifier to amplify the input voltage from the electret microphone. Unlike MOSFETs and BJTs which require a bias voltage to operate in active/saturation region, JFETs can be active when VGS=0. As a result, these microphones do not require an additional bias voltage at the gate of the JFET. This backscatter microphone design leverages the fact that the JFET is active when VGS=0 so that it can be used as a voltage controlled resistance when connected to the antenna.

Figure 9:
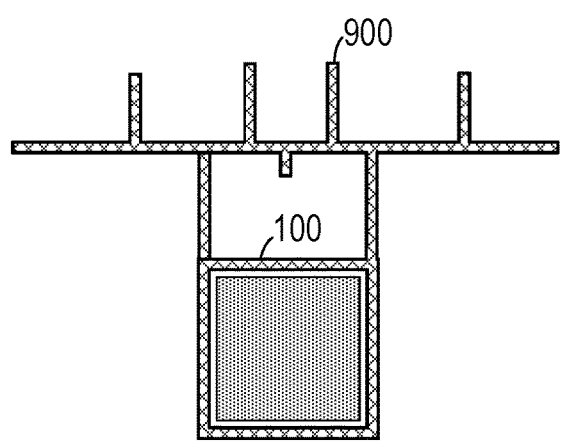
FIG. 9 is a schematic diagram, showing a transducer with a second alternative antenna.

While a dipole antenna 400 is shown above, a surface tag-type antenna 810 may also be employed with the transducer 100 configured as a variable voltage source. Also, as shown in FIG. 9, a surface tag arrangement 900 can configure the transducer 100 as a variable capacitor.

Figure 10:
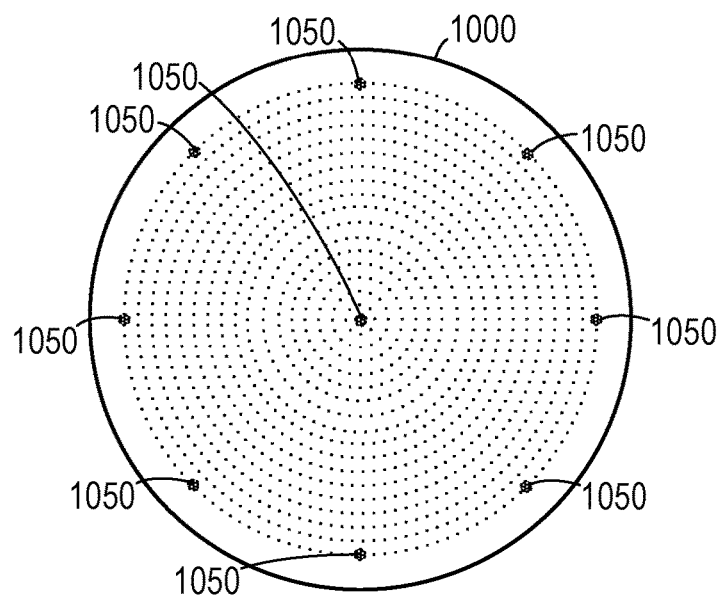
FIG. 10 is a schematic diagram, showing one representative circular embodiment of a transducer.

As shown in FIG. 10, a transducer 1000 can be configured in a circular geometry. In this geometry the holes and attachment points 1050 can be arranged in a circular pattern.

Figure 11:
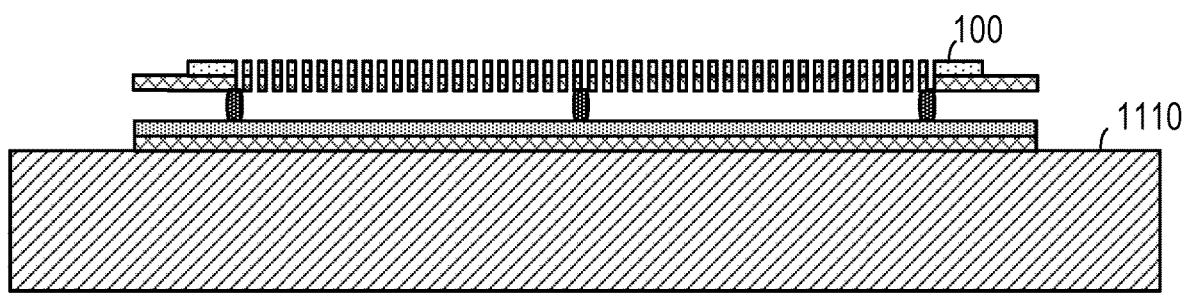
FIG. 11 is a schematic diagram, showing a transducer mounted on a supporting substrate.

As shown in FIG. 11, the transducer 100 can be mounted on a frame 1110 for increasing structural integrity. The frame material could be rigid or could be a foam material. Generally, it is desirable for the material of the frame to be selected so as to minimize dampening of vibrations with a lower Young's modulus.

One experimental embodiment is a self-powered microphone that is thin, flexible, and easily manufactured. This acoustic sensor takes advantage of the triboelectric generator to transform vibrations into an electric signal without applying an external power source. One advantage of this audio material sensor is that it can be manufactured simply and deployed easily to convert every-day objects and physical surfaces into microphones which can sense audio. Certain features include:

Low-cost fabrication: the microphone allows for a fabrication technique that is inexpensive and does not significantly compromise signal quality.

Wider acoustic range: the embodiment offers a thin sound sensing material that is sensitive across this wider band of the human audible range and provides sensitivity beyond the voice band, including up 4-6 kHz for sound clarity and definition.

Performance reliability: the fabrication techniques are reproducible such that two microphones produced with the same technique are similar in acoustic performance.

Certain embodiments of the invention could power radio transmitters, in which the sound is maintained above a loudness threshold, allowing real-time alerts to sounds that exceed the threshold. In this manner, acoustic environmental monitoring can be performed without the cost and environmental difficulties of batteries. Applications can include monitoring for sound thresholds exceeding human hearing tolerance, such as in construction zones, mines, music venues, power stations, airports, spaceports, and military environments. Similarly, sensors according to the present invention might be used for monitoring events such as landslides, avalanches, polar ice breaking, mine cave-ins, and mine gas explosions.

One embodiment includes a self-powered microphone that enables interaction with objects. The microphone's flexibility and form factor allows the attaching of a microphone to common objects, such as a bottle. For example, in one experimental embodiment, a 4 cm×4 cm microphone patch was placed on a soda bottle to enable interactions. Using such an embodiment, a person can give voice commands like—"let's share a cola" which can enable the actuating of a display. With appropriate storage, computation and communication, a wide variety of interactive voice-activated capabilities are possible. Also, the present microphones can be used in the environment for smart home control. The present invention can act as easy to deploy, cheap microphones that have a form factor of a sticky note, which can be applied anywhere in the home. The invention can be employed in a self-powered microphone for localization of a sound source. The microphone is a skin-like sensor that can be placed on curved surfaces in a room like a curtain, wall, or a table top to gather context. Multiple microphone patches can easily be placed on the surface of a table, and in combination can be used to localize a speaker. As people speak, the location can simply be determined by comparing voltage output of multiple microphone patches. The patch placed near to the speaker will pick up more signal than one placed further such that even a simple algorithm of threshold amplitude comparison can detect which speaker is actively talking.

Additional applications include monitoring for sound thresholds exceeding human hearing tolerance, such as in construction zones, mines, music venues, power stations, airports, spaceports, and military environments. Similarly, microphone-based sensors might be used for monitoring events such as landslides, avalanches, polar icebreaking, mine cave-ins, and mine gas explosions.

In one example, an airport can monitor its acoustic environment so as to not exceed safe noise levels for its employees or to keep aircraft noise footprints within airport boundaries. A patch microphone system can be tiled on various buildings and at various distances on the runway. As planes take off, they generate loud sounds due to gears, fans, and air turbulence. The peak in the sound spectrum generated by aircraft is near the 200-300 Hz band with decibel levels reaching greater than 105 dbSPL at 5 $m^3$. These values are consistent with the resonant frequency of the microphone patch and would result in the generation of power>6.9 µW accumulated over different frequency bands. Considering the maximum power transfer theorem, the usable power obtainable from such phenomenon is approximately 50%/a. Thus, the embodiment might harvest up to 3.4 µW. The energy required to program a "1" in a NAND ash memory is 2 µJ. Given that the sounds we are expecting will probably last for several seconds, there is more than enough power to record the acoustic event. Going further, SRAM bits can be flipped at approximately 10-100 pW of power, suggesting that rudimentary computation might be performed to determine if the flash memory bit should be written. A worker can then visit each microphone site, interrogating the system using a passive RFID mechanism. When the worker places the active RFID reader above each transducer system, it reads the state of the recorded bit and resets the system so that it is ready to catch the next episode. Going further, after detecting a loud sound, the microphone system might use its harvested power to power a RF transmitter to announce the event. In one embodiment, a microphone-based system can store power until it has enough to enable a 915 Mhz backscatter transmission to the receiving antenna, announcing the event. As long as the event continues to occur, the microphone system can transmit alerts every few seconds to a remote monitoring station.

In one method of making an experimental embodiment, the following steps were employed:

Preparation of micro-hole paper: We start with standard copier paper of 0.04 mm thickness. 400 µm diameter holes with an even spacing of 200 µm are cut into the paper in a grid pattern using a micro-laser cutter, a Universal Laser System PLS6MW using 9.3 µm $CO_2$ at 80% power and a 700 PPI raster mode at 20% speed. The hole pattern forms a 4 cm×4 cm square grid. A small border of 5 mm on one side and 2 mm on the other side is left to be used for attachment to the PTFE layer. This border is kept small to ensure ease of reproducibility of the cavity created between copper and paper after being attached together.

Deposition of copper layer: The paper sheet with micro-holes (step 1) and a PTFE sheet (6 cm×6 cm with 0.05 mm thickness) are coated on one side with a thin layer of copper that act as electrodes. The copper is applied using a standard sputtering technique inside a PVD chamber (a Leskar PVD75) with a chamber pressure of 6×10–6 torr. The deposition time is set to 45 minutes, resulting in a 0.15 µm copper layer thickness on the paper and the PTFE. This allows the copper to deposit on the paper but not obstruct the micro-holes. The border of the perforated-paper is also coated with copper.

Attaching copper tape as electrodes: We attach conductive copper tape to the copper coated side of the paper and the PTFE in order to extend the electrodes for measurement purposes or to connect to an external circuit.

Stacking paper and PTFE: The paper and PTFE are placed on top of each other such that the copper layer of paper is on top of the non-coated side of PTFE, which is non-conducting. To avoid a short circuit, we ensure that the copper tape attached to the copper coated side of the paper does not touch the copper laminated side of the PTFE and vice versa. Finally, the copper tape from the paper is attached to the second copper tape on the uncoated side of PTFE.

Gluing paper and PTFE: The paper layer (copper side facing PTFE) is glued to the uncoated PTFE side using glue dots at nine anchor points. Structural parameter values mentioned above, like hole size, hole spacing, and attachment points for paper to PTFE, were determined by performing experiments and simulation. The final thickness of the constructed transducer patch was measured to be 150 µm, which is comparable to that of standard copier paper. This sensor can be attached to objects using glue on the edges of copper side of the PTFE layer.

The microphone of the present invention provides an advantageous form factor which is thin and flexible and can be exploited in a number of planar and circular configurations.

One experimental embodiment of the transducer of the present invention is a skin-like sensor that can be placed on different flat or curved surfaces in a room like a curtain, wall, or a table top to gather context. Multiple transducer patches can easily be placed on the surface of a table, and in combination can be used to localize a speaker. As people speak, the location can simply be determined by comparing voltage output of multiple transducer patches. The patch placed near to the speaker will pick up more signal than one placed further such that even a simple algorithm of threshold amplitude comparison can detect which speaker is actively talking. When a first speaker speaks, the closer microphone has higher amplitude than another microphone. Similarly, when a second speaker starts speaking, the closer microphone has higher amplitude than the other microphone. Such infrastructure can be expanded to multiple parts of the table, given the number of speakers. Such transducers can even be placed on walls/ceilings/floors in order to localize speakers within the entire room using more sophisticated processing of the combined signals.

The transducer's flexibility and form factor allows the possibility of attaching a microphone to everyday objects, such as a bottle. A 4×4 cm² transducer patch can be placed on a soda bottle to enable interactions. A person may give voice commands like—"let's share a cola", which can enable control like actuating a display. With appropriate storage, computation and communication, a wide variety of interactive voice-activated capabilities become possible In one embodiment, power from sound can be used to flip a bit in a non-volatile memory cell in response to a loud sound. That bit could be read using a passive RFID mechanism. Such a system could be used for inexpensive, battery-free ambient monitoring of sources of noise pollution or detection of faults in mechanical systems (e.g., leaky high pressure valves). The transducer could power radio transmitters when ambient sound is maintained, allowing real-time alerts to sounds that exceed a loudness threshold. In this manner, acoustic environmental monitoring can be performed without the cost and environmental difficulties of batteries.

Applications of certain embodiments can include monitoring for sound thresholds exceeding human hearing tolerance, such as in construction zones, mines, music venues, power stations, airports, spaceports, and military environments. Similarly, transducer-based sensors of the type disclosed herein might be used for monitoring events such as landslides, avalanches, polar ice breaking, mine cave-ins, and mine gas explosions. In a military application, transducer-based sensors could be dropped from an airplane into a conflict zone. The sensors would monitor the acoustic environment for the movement of tanks, mortars, or exploding ordinance. Later, a device could sweep the field to interrogate the sensors.

In one example, airport could monitor its acoustic environment so as to not exceed safe noise levels for its employees or to keep aircraft noise footprints within airport boundaries. A transducer-based system could be tiled on various buildings and at various distances on the runway. As planes take off, they generate loud sounds due to gears, fans, and air turbulence. The peak in the sound spectrum generated by aircraft is near the 200-300 Hz band with decibel levels reaching >105 dbSPL at 5 m3. These values are consistent with the resonant frequency of the transducer patch and would result in generation of power>6.9 µW accumulated over different frequency bands. Considering the maximum power transfer theorem (Jacobi's law) the usable power we can obtain from such phenomenon is approximately 50%. Thus, the device might harvest up to 3.4 µW. The energy required to program a "1" in a NAND flash memory is 2 µJ. Given that the sounds we are expecting will probably last for several seconds, there would be more than enough power to record the acoustic event. Going further, SRAM bits can be flipped at approximately 10-100 pW of power, suggesting that rudimentary computation might be performed to determine if the flash memory bit should be written. A worker could then visit each transducer site, interrogating the system using a passive RFID mechanism. When the worker places the active RFID reader above each transducer system, it reads the state of the recorded bit and resets the system so that it is ready to catch the next episode.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not. Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A responsive vibration transducer, comprising:
(a) a first flexible triboelectric member, including a first triboelectric layer having a first side, an opposite second side and a peripheral edge, the first triboelectric layer including a material being on a first position on a triboelectric series, the first flexible triboelectric member also including a conductive layer deposited on the second side thereof;
(b) a second triboelectric member including, a second triboelectric layer having a first side, an opposite second side and a peripheral edge, the second triboelectric layer including a material being on a second position on the triboelectric series that is different from the first position on the triboelectric series, the second triboelectric member adjacent to the first flexible triboelectric member so that the second side of the second triboelectric layer faces the first side of the first triboelectric layer and is spaced apart therefrom at a distance that results in partial contact between the first triboelectric layer and the second triboelectric layer when the vibrations impinge on the vibration transducer while at rest;
(c) at least one of the first flexible triboelectric member and the second flexible triboelectric member defining an array of a plurality of holes passing therethrough, each of the plurality of holes having a diameter within a predetermined range;
(d) a plurality of attachment points affixing the first triboelectric member in a fixed relationship to the second triboelectric member, at least a first set of the attachment points disposed along a periphery of the vibration transducer and at least one attachment point disposed interior to the periphery of the vibration transducer wherein the first flexible triboelectric member and the second triboelectric member each have a quadrilateral shape having four corners and wherein the plurality of attachment points comprise:
four corner glue points in which each corner glue point is disposed at a different one of the four corners;

a plurality of edge glue points in which each edge glue point is disposed along a peripheral edge of the quadrilateral shape; and at least one internal glue point disposed in an area inside of the quadrilateral shape;

(e) an antenna member electrically coupled to the first flexible triboelectric member and to the second triboelectric member, wherein when the first triboelectric member comes into and out of contact with the second triboelectric member as a result of the vibrations, a triboelectric potential difference having a variable intensity corresponding to the vibrations can be sensed between the first electrode and the second electrode, and wherein when a radio-frequency carrier wave is transmitted to the antenna member, a local potential is induced in the transducer and the vibrations are modulated onto the local current resulting in a backscatter radio-frequency signal that corresponds to a modulation of the vibrations onto the carrier wave being generated by the transducer.

2. The responsive vibration transducer of claim 1, wherein the antenna member comprises at least one active circuit component.

3. The responsive vibration transducer of claim 2, wherein the active circuit component comprises a JFET.

4. The responsive vibration transducer of claim 1, wherein each of the plurality of attachment points is disposed at a position so as to maximize energy production by the transducer.

5. The responsive vibration transducer of claim 1, wherein the second triboelectric member further comprises a flexible substrate affixed to the first side of the first triboelectric layer.

6. The responsive vibration transducer of claim 5, wherein the flexible substrate comprises a selected one of a paper or a plastic and wherein the second triboelectric layer comprises a copper deposition on the flexible substrate.

7. The responsive vibration transducer of claim 1, wherein the first triboelectric layer comprises a film including a selected one of polytetrafluoroethylene or fluorinated ethylene propylene and wherein the conductive layer comprises copper.

8. The responsive vibration transducer of claim 1, wherein the holes are disposed in a grid pattern.

9. A responsive vibration transducer, comprising:

(a) a first flexible triboelectric member, including a first triboelectric layer having a first side, an opposite second side and a peripheral edge, the first triboelectric layer including a material being on a first position on a triboelectric series, the first flexible triboelectric member also including a conductive layer deposited on the second side thereof;

(b) a second triboelectric member including, a second triboelectric layer having a first side, an opposite second side and a peripheral edge, the second triboelectric layer including a material being on a second position on the triboelectric series that is different from the first position on the triboelectric series, the second triboelectric member adjacent to the first flexible triboelectric member so that the second side of the second triboelectric layer faces the first side of the first triboelectric layer and is spaced apart therefrom at a distance that results in partial contact between the first triboelectric layer and the second triboelectric layer when the vibrations impinge on the vibration transducer while at rest;

(c) at least one of the first flexible triboelectric member and the second flexible triboelectric member defining an array of a plurality of holes passing therethrough, each of the plurality of holes having a diameter within a predetermined range; a plurality of attachment points affixing the first triboelectric member in a fixed relationship to the second triboelectric member;

(d) at least a first set of the attachment points disposed along a periphery of the vibration transducer and at least one attachment point disposed interior to the periphery of the vibration transducer wherein the first flexible triboelectric member and the second triboelectric member each have a circular shape having a periphery and wherein the plurality of attachment points comprise:

a plurality of spaced apart glue points disposed along the periphery of the circular shape; and at least one glue point disposed in an interior area of the circular shape; and (e) an antenna member electrically coupled to the first flexible triboelectric member and to the second triboelectric member, wherein when the first triboelectric member comes into and out of contact with the second triboelectric member as a result of the vibrations, a triboelectric potential difference having a variable intensity corresponding to the vibrations can be sensed between the first electrode and the second electrode, and wherein when a radio-frequency carrier wave is transmitted to the antenna member, a local potential is induced in the transducer and the vibrations are modulated onto the local current resulting in a backscatter radio-frequency signal that corresponds to a modulation of the vibrations onto the carrier wave being generated by the transducer.

10. The responsive vibration transducer of claim 9, wherein the holes are disposed in a circular pattern.

11. The responsive vibration transducer of claim 9, wherein the antenna member comprises at least one active circuit component.

12. The responsive vibration transducer of claim 11, wherein the active circuit component comprises a selected one of a JFET or a MOSFET.

13. The responsive vibration transducer of claim 9, wherein each of the plurality of attachment points is disposed at a position so as to maximize energy production by the transducer.

14. The responsive vibration transducer of claim 9, wherein the second triboelectric member further comprises a flexible substrate affixed to the first side of the first triboelectric layer.

15. The responsive vibration transducer of claim 14, wherein the flexible substrate comprises a selected one of a paper or a plastic and wherein the second triboelectric layer comprises a copper deposition on the flexible substrate.

16. The responsive vibration transducer of claim 9, wherein the first triboelectric layer comprises a film including a selected one of polytetrafluoroethylene or fluorinated ethylene propylene and wherein the conductive layer comprises copper.

* * * * *